US009261890B2

(12) United States Patent
Dimitrovski

(10) Patent No.: US 9,261,890 B2
(45) Date of Patent: Feb. 16, 2016

(54) POWER FLOW CONTROL USING DISTRIBUTED SATURABLE REACTORS

(75) Inventor: Aleksandar D. Dimitrovski, Knoxville, TN (US)

(73) Assignee: UT-BATTELLE, LLC, Oak Ridge, TN (US)

( * ) Notice: Subject to any disclaimer, the term of this patent is extended or adjusted under 35 U.S.C. 154(b) by 280 days.

(21) Appl. No.: 13/984,196

(22) PCT Filed: Feb. 22, 2012

(86) PCT No.: PCT/US2012/026111
§ 371 (c)(1),
(2), (4) Date: Aug. 7, 2013

(87) PCT Pub. No.: WO2012/128882
PCT Pub. Date: Sep. 27, 2012

(65) Prior Publication Data
US 2013/0320940 A1    Dec. 5, 2013

Related U.S. Application Data

(60) Provisional application No. 61/446,515, filed on Feb. 25, 2011.

(51) Int. Cl.
*H03F 9/02* (2006.01)
*G05F 1/32* (2006.01)

(52) U.S. Cl.
CPC ... *G05F 1/32* (2013.01); *H03F 9/02* (2013.01)

(58) Field of Classification Search
CPC .................................... G05F 1/32; H03F 9/02
See application file for complete search history.

(56) References Cited

U.S. PATENT DOCUMENTS

| 2,552,952 A | 5/1951 | Gachet et al. |
| 2,598,617 A | 5/1952 | Stimler |

(Continued)

FOREIGN PATENT DOCUMENTS

EP    0 357 411 A2    3/1990

OTHER PUBLICATIONS

International Search Report and Written Opinion dated Oct. 17, 2012, for corresponding application PCT/US2012/026111, pp. 1-17.

(Continued)

*Primary Examiner* — Emily P Pham
(74) *Attorney, Agent, or Firm* — Brinks Gilson & Lione

(57) ABSTRACT

A magnetic amplifier includes a saturable core having a plurality of legs. Control windings wound around separate legs are spaced apart from each other and connected in series in an anti-symmetric relation. The control windings are configured in such a way that a biasing magnetic flux arising from a control current flowing through one of the plurality of control windings is substantially equal to the biasing magnetic flux flowing into a second of the plurality of control windings. The flow of the control current through each of the plurality of control windings changes the reactance of the saturable core reactor by driving those portions of the saturable core that convey the biasing magnetic flux in the saturable core into saturation. The phasing of the control winding limits a voltage induced in the plurality of control windings caused by a magnetic flux passing around a portion of the saturable core.

22 Claims, 8 Drawing Sheets

(56) References Cited

U.S. PATENT DOCUMENTS

| | | | |
|---|---|---|---|
| 2,938,128 A | | 5/1960 | Logan |
| 3,809,980 A | | 5/1974 | Nottingham, Jr. |
| 4,328,458 A | * | 5/1982 | Hiromitsu ............... 323/251 |
| 4,342,075 A | * | 7/1982 | Hiromitsu ............... 363/23 |
| 4,352,026 A | | 9/1982 | Owen |
| 5,642,249 A | * | 6/1997 | Kuznetsov ............... 361/58 |
| 2006/0197523 A1 | * | 9/2006 | Palecki et al. ............ 324/244 |
| 2010/0188786 A1 | * | 7/2010 | Darmann ............... 361/19 |
| 2010/0213884 A1 | * | 8/2010 | Xiang ............... 318/400.36 |

OTHER PUBLICATIONS

Perdigão et al., "Magnetic Regulator Topoligies for Dimmable Electronic Ballasts", pp. 921-926; 2010, IEEE.

Belyaev et al., "Steady-State and Transient Stability of 500 kV Long-Distance AC Transmission Lines with Magentically Controlled Shunt Reactors", pp. 1-6; Jun. 2005; IEEE.

Bolgov et al., "Suppression of Voltage Flicker by Saturable Reactor Operating Under Forced Magnetization", pp. 1417-1422; 2007, IEEE.

\* cited by examiner

POWER FLOW CONTROL USING DISTRIBUTED SATURABLE REACTORS

RELATED APPLICATION

This application claims the benefit of priority of U.S. Provisional Pat. App. No. 61/446,515 filed Feb. 25, 2011 and titled "Power Flow Control Using Distributed Saturable Reactors," which is incorporated by reference.

The present patent document is the national stage of International Patent Application PCT/US2012/026111, filed on Feb. 22, 2012, which is hereby incorporated by reference.

STATEMENT REGARDING FEDERALLY SPONSORED RESEARCH AND DEVELOPMENT

This application was made with United States government support under Contract No. DE-AC05-00OR22725 awarded by the United States Department of Energy. The United States government has certain rights in these inventions.

BACKGROUND

1. Technical Field

This application relates to devices in which electrical signals control the flow of electrical power and, more particularly, to devices that control reactance through the application of a control current.

2. Related Art

Some saturable reactors control current flow through changing reluctance (magnetic resistance). The core of these reactors may be magnetically saturated in which the magnetic domains of the core are lined up with a magnetizing force.

Before reaching saturation, the reactor's magnetic permeability and impedance to a winding with an alternating current may be large, limiting alternating current flow. As the core reaches saturation, its reactance (impedance) may be significantly smaller. Once saturated, the core may simulate an air core.

In power applications, such as applications that may convey megawatts of power at kilovolts voltage levels to a load, significant amounts of biasing current and a very low resistance might be needed to bias a core into saturation. Superconductive windings and cryogenic equipment are required to lower the resistance and power consumption of a biasing circuit. And, a significant biasing source would also be required to drive the core into saturation.

SUMMARY

A magnetic amplifier controls high-voltage power flow through power systems. The magnetic amplifier includes a saturable core having a plurality of legs. Two or more control windings wound around a separate leg of the saturable core are spaced apart from each other and connected in series in an anti-symmetric relation. The control windings are configured in such a way that a biasing magnetic flux arising from a control current (e.g., direct current(s) or low frequency alternating current(s)) flowing through one of the control windings is substantially equal to the biasing magnetic flux flowing into a second control windings. The control current flow through each of the plurality of control windings changes the reactance of the saturable core by driving those portions of the saturable core that convey the biasing magnetic flux into saturation. The phasing of the control winding cancels or limits a voltage induced in the plurality of control windings caused by a magnetic flux produced by an alternating load current passing around a portion of the saturable core.

Other systems, methods, features, and advantages will be, or will become, apparent to one with skill in the art upon examination of the following figures and detailed description. It is intended that all such additional systems, methods, features and advantages be included within this description, be within the scope of the invention, and be protected by the following claims.

DETAILED DESCRIPTION OF THE PREFERRED EMBODIMENTS

A magnetic amplifier may include a core that provides a controllable reluctance for magnetic flux, a power winding, which receives energy from an alternating current ("ac") source and delivers alternating load current to load and two or more separate control windings coupled in series that receive power from a geographically local source that may be power system dependent or independent. The control windings are configured in such a way that the bias magnetic flux generated by the control current (e.g., ac or direct current "dc") flowing through the control winding does not flow through the power windings and gaps that may be positioned in the core. The layout and phasing of the control windings cancel out or limit the voltage induced in the control windings caused by the load current passing through the power windings and limit the control current flux flow to a specified portion of the core. The placement of the control windings and gaps positioned in the core confine the saturation of the core to a particular area or portion that increases the reluctance of the ac flux (impedes the ac flux) which decreases the reactance (voltage drop) in the power winding.

The core may comprise a saturable material. In some saturable reactors and magnetic amplifiers, the core may have different core geometries and structures and may be made of one or more magnetizing materials such as steel, iron, ferrous alloy(s), nickel iron, or other saturable materials for example. Different cross-sections of the core may have different saturation levels due to flux flow, use of saturable materials, positioning of gaps, and other factors. The cross-sections may comprise many shapes and geometries that may include substantially rectangular, circular, or oval shapes, for example.

Figure 1:
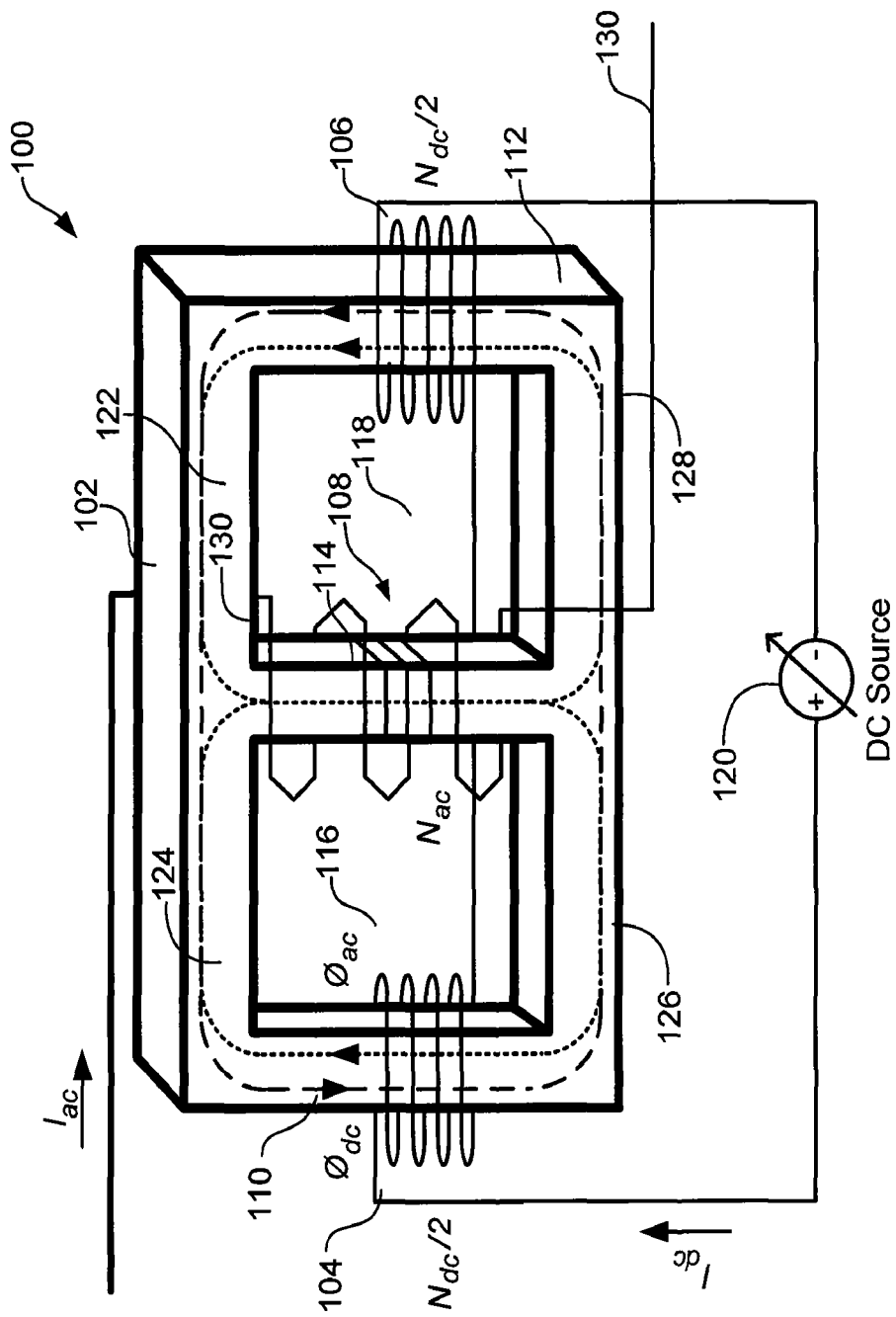
FIG. 1 is a magnetic amplifier.

FIG. 1 is a front view of a magnetic amplifier 100 that uses anti-symmetric dc control windings 104 and 106 and air-like portions 108 within selected portions of the saturable core 102 to control magnetic flux flow. The control windings 104 and 106 are anti-symmetric in a sense that the amount of dc magnetic flux flowing into one of the control windings is substantially equal to the amount of dc magnetic flux flowing out of a second and separate control winding. In one such implementation, one of the control windings 106 as shown in FIG. 1 are cylindrical in form and are wound in a helix around a distal outer leg 112 of the saturable core 102 in a clockwise configuration and a second control winding 104 also cylindrical in form and comprising the same number of turns (or substantially the same number of turns) is wound in a helix around a proximal outer leg 110 of the saturable core 102. In this implementation, the outer legs 110 and 112 have substantially uniform magnetic cross-sections without the air gaps 108 or non-magnetic material shown in some of the alternating magnetic flux flow paths, which in FIG. 1 is positioned in the middle or center leg 114. In some magnetic amplifiers the non-magnetic material may comprise a porous non-ferromagnetic material that has substantially similar magnetic properties to air and may be placed in any area of the saturable core 102 seen only by the magnetic flux generated by the power winding.

The control windings 104 and 106 wound around the proximal and distal legs 110 and 112 may be positioned in a parallel or substantially parallel alignment with each other with each control winding separated by substantially symmetrical windows 116 and 118 that are bounded by the middle or center leg 114. When the control windings 104 and 106 are energized by a local power system dependent (e.g., rectified from the AC source, but at a low voltage) or power system independent dc circuit or source 120, a bias magnetic flux is established in the proximal and distal legs 110 and 112 of the magnetic amplifier's core 102. This bias magnetic flux (also referred to as the "dc flux" in dc applications) passes through the joining portions 122-128 of the core 102, such that the dc flux generated by one control winding is substantially the same amount of dc flux received by the second control winding. The voltage, current, and power that source the control windings 104 and 106 is sufficiently low enough because the dc flux does not pass through or is substantially dampened by the air gaps 108 or non-magnetic material shown in the center leg 114 of FIG. 1 (e.g., it does not pass through a substantial portion of the center leg 114). When saturation is reached, the portion of the core 102 in which substantially all of the direct current flux flows acts like an open space or air gap. Since the direct flux flow path also conveys some of the alternating magnetic flux, the simulated air gap changes the reluctance and lowers the reactance (voltage drop) seen in the power winding 130.

More particularly the alternating magnetic flux flow and direct current magnetic flux flow is shown in FIG. 1. The split core 102 has three legs (a distal leg 112, a center leg 114, and a proximal leg 110) and four joining portions 122-128. When the core 102 is not saturated, the alternating current flowing through the power winding 130 will generate an alternating magnetic flux proportional to the alternating current flow that will flow through the legs 110-114 and joining portions 122-128 of the core 102. Before reaching saturation a change in the alternating current creates a corresponding change in the alternating magnetic flux that generates an electromotive force that opposes change in alternating current flow in the power winding 130. When the control windings 104 and 106 saturate portions of the core 102, the portion of the core 102 in which the direct current flux flows becomes saturated. Since the alternating current magnetic flux flows throughout the entire core 102 of the magnetic amplifier 100, the portion of the core 102 in which the direct current flux flows is a shared path (e.g., in FIG. 1 the shared path comprises the distal and proximal legs 110 and 112 and the joining portions 122-128). Saturation of the shared path impedes the alternating magnetic flux flow through these alternating magnetic flux flow paths resulting in a smaller equivalent impedance to the alternating current flowing through the power winding 130. The saturated portions simulate an air core having a reluctance of about three to four orders of magnitude smaller (e.g., $10^3$-$10^4$, thousand to ten thousand times) than when the portions are not saturated.

In FIG. 1, the saturation of portions of the core 102 is controlled by a dc circuit 120 that is magnetically coupled to the alternating current circuit. The dc circuit 120 may include a local embedded or external power electronic converter such as an ac/dc converter or rectifier that may change the voltage, current, and frequency of the alternating source sourcing the alternating current Iac that is shown. A change in the amount of biasing magnetic flux produced by the current flowing through the dc circuit 120 changes the reactance in the alternating current circuit. As a result, the current flow through the alternating current circuit will change in correspondence to the changed reactance. The reactance may range from a magnitude that is equivalent to an air core (e.g., an air core inductance) when portions of the core are saturated, to a reactance that of three to four orders of magnitude larger. In FIG. 1 the range of control of the alternating current flow through the power winding 130 may depend on the ratio of reactor impedance to the total impedance in circuit. In some applications, the range of current (and/or voltage control) may depend on the range of change in the reluctance of the core 102. The level of incremental control of the inductance (or reactance) may also depend on the level of control of the dc biasing current.

Figure 6:
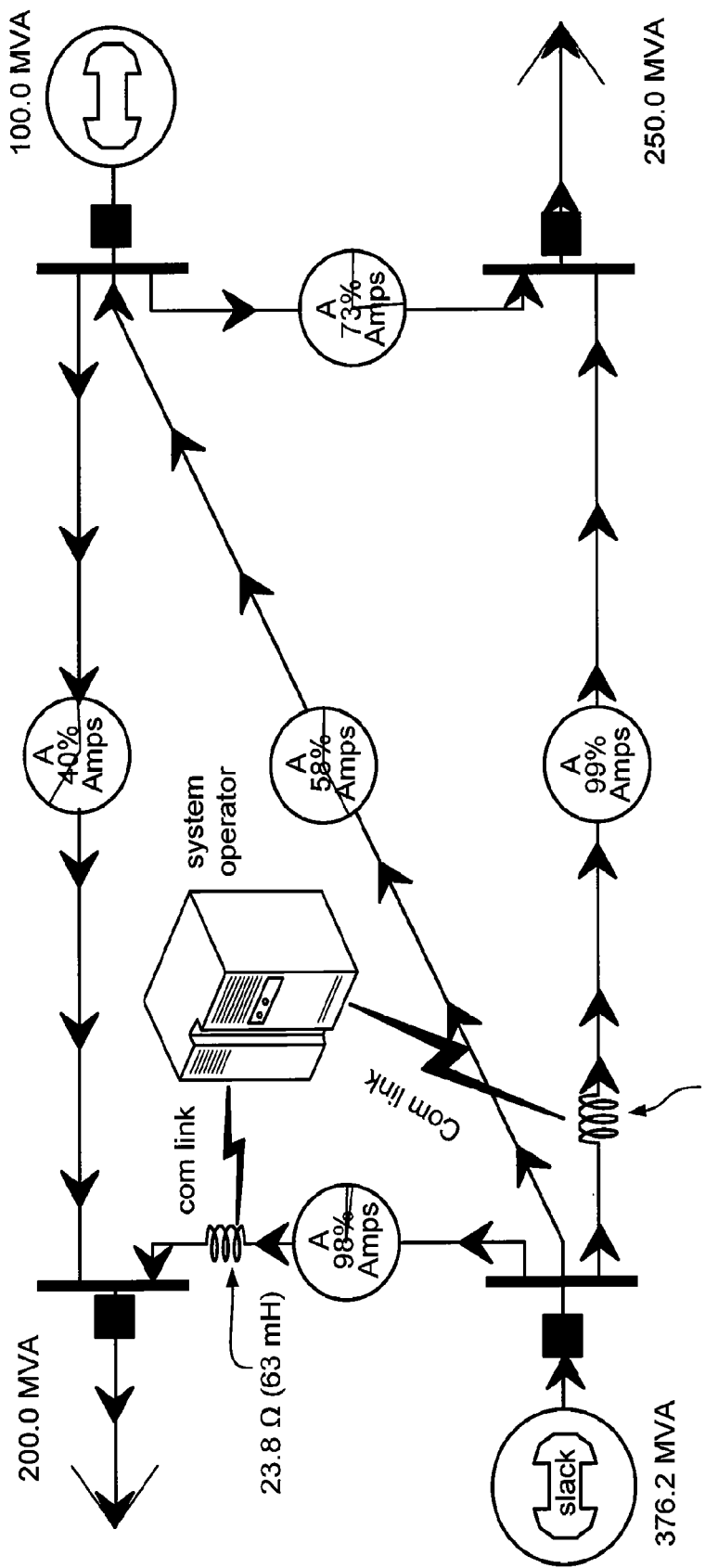
FIG. 6 is a third line diagram of a magnetic amplifier controlled power flow.
Figure 8:
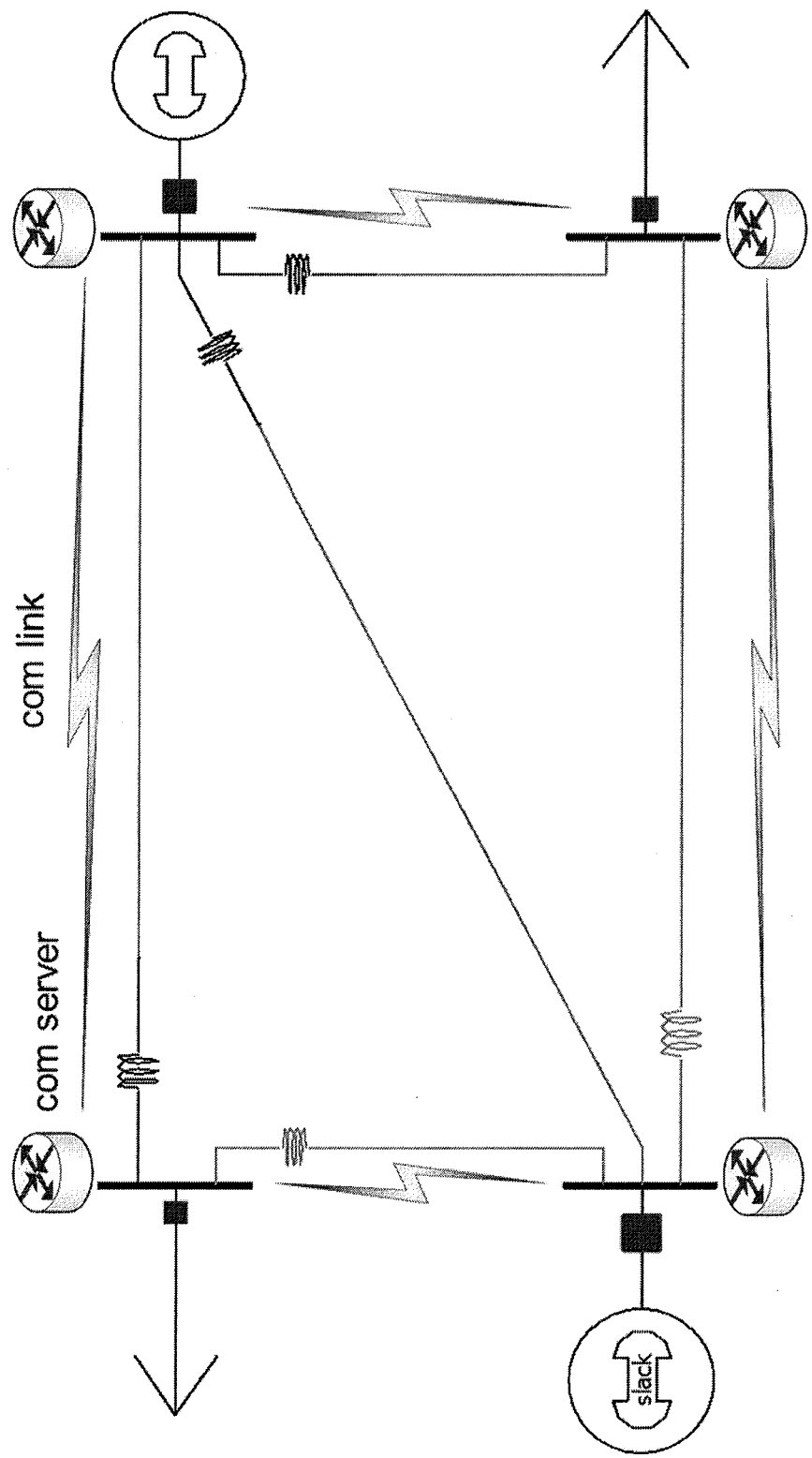
FIG. 8 is a wide area power flow controller connection diagram.

The magnetic materials used in the magnetic amplifier 100 may have a high magnetic permeability and low coercivity. The magnetic amplifier 100 is installed in-line or in series with any power line including high voltage (>1 kV), extra high voltage (>230 kV), or ultra-high voltage (>765 kV) power distribution and transmission lines. The small relative size of the magnetic amplifier 100 relative to some typical constructions that control high voltage power flow may allow the magnetic amplifiers to be installed with an enclosure at the elevated potential of the power line voltage. The magnetic amplifiers may be deployed system wide in a distributed power system architecture and may be self-monitored and controlled. Some magnetic amplifiers are remotely monitored and controlled through a wireless or physical communication link from one or more geographically remote locations as shown in FIG. 6 or 8.

Figure 2:
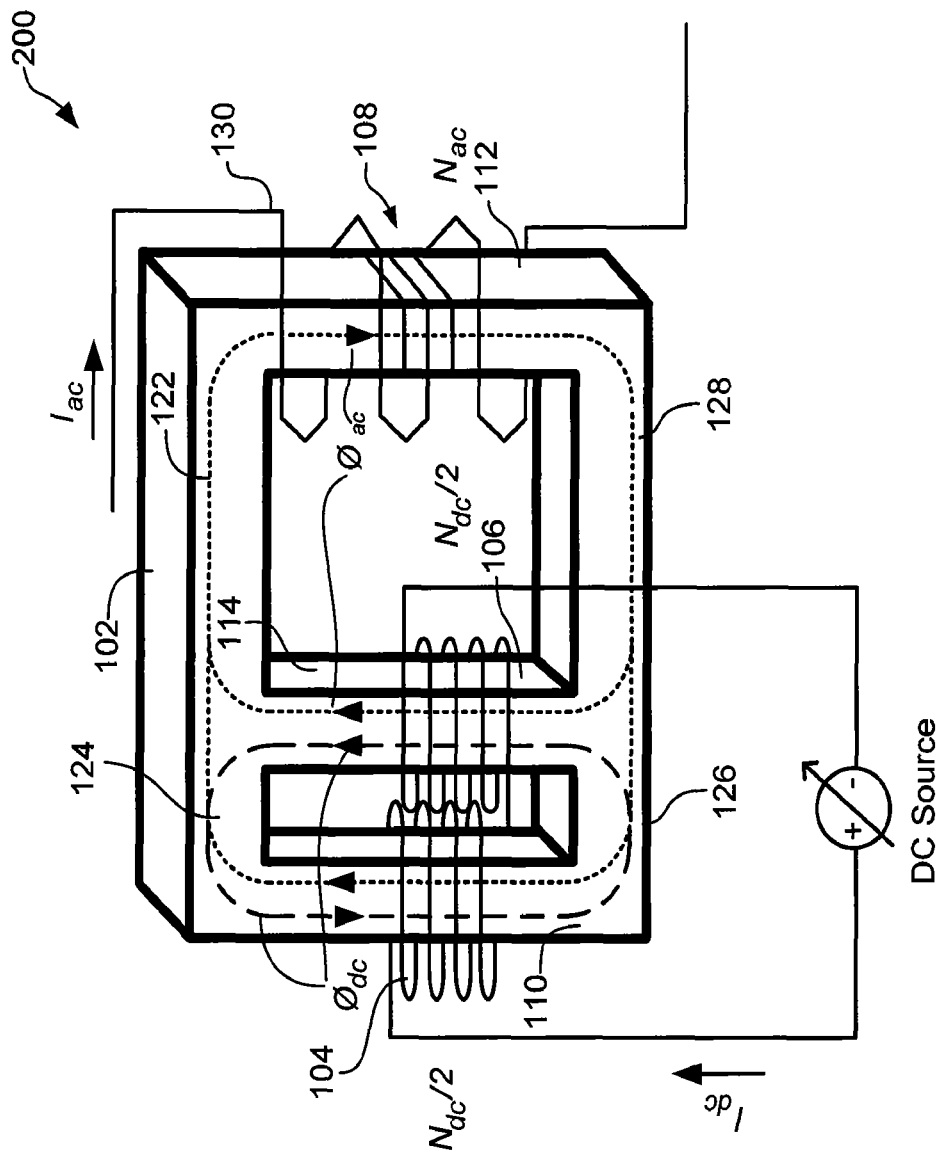
FIG. 2 is an alternative magnetic amplifier.

FIG. 2 is an alternative magnetic amplifier 200. Like the magnetic amplifier 100 shown in FIG. 1, the core 102 of the magnetic amplifier 200 has three legs: a distal leg 112, a proximal leg 110, and a center leg 114. Additionally, the saturable core 102 includes joining portions 122-128 disposed between the proximal and distal legs 110 and 112 of the core 102 that form a parallelogram. However, the joining portions 122-128 of the core 102 shown in FIG. 2 are not substantially equal in length as shown in FIG. 1. The opposing joining portions 124 and 126 disposed between the control windings 104 and 106 that are substantially equal in length and substantially parallel, but shorter in length than the opposing joining portions 122 and 128 that separate the power line winding 130 wound about the distal leg 112, and one of the control windings 106 wound about the center leg 114.

In operation, a small control dc biasing current (e.g., relative to the alternating current source driving the power winding) effectively controls the power flow through the power winding 130. When the control windings 104 and 106 (connected in series) are energized by a power source such as electronic converter, a bias magnetic flux flows through the proximal and center legs 110 and 114 of the three-legged saturable core 102. The bias magnetic flux passes through the shorter joining portions 124 and 126 of the core 102, such that the bias magnetic flux generated by one control winding is substantially the same amount of bias magnetic flux received by the second control winding. In FIGS. 1 and 2, the bias magnetic flux circulates locally (e.g., not passing through or with a minimal amount passing through the portion of the core 102 that power winding 130 circulates around, orbits, or translates about). Local bias magnetic flux flow may occur by the substantially equal and opposite polarity established between the lower ends of the control windings 104 and 106 and/or the substantially equal and opposite polarity between the upper ends of the control winding 104 and 106 that have substantially the same number of turns. Some magnetic amplifiers may include air gaps 108 and/or non-magnetic materials positioned in the portion of the saturable core 102 that the power winding 130 orbits about to achieve an accepted level of reactance for the alternating current circuits. The air gaps 108 and/or no-magnetic materials may further limit the bias magnetic flux to a local circulation.

When portions of the core 102 shown in FIG. 2 are driven into saturation, the alternating current flowing through the power winding 130 increases in relation to the graduated change or decrease of the magnetic reluctance/reactance of the core 102. A decrease because the portion of the core 102 in which the bias magnetic flux passes through acts like a virtual air gap. As a result, the current delivered through the power winding 130 (e.g., the current delivered to an alternating current load) may correspond to the length and the state of the local bias magnetic flux flow path. Like a magnetic valve that uses a magnetic field to control a current flow, as portions of the core 102 are driven into saturation, the reactance in the power winding 130 decreases which decreases the opposition to the flow of alternating current caused by the inductance in the core 102, that will increase the level of power delivered by the magnetic amplifier 200.

Figure 3:
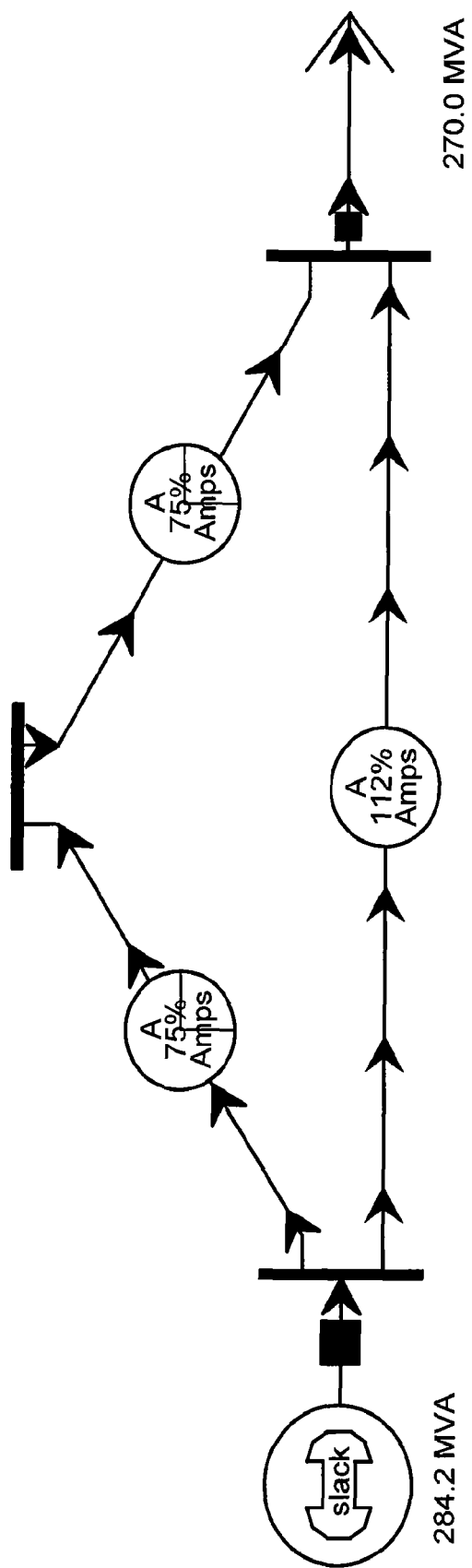
FIG. 3 a line diagram of an uncontrolled power flow.

FIG. 3 shows a one-line diagram of an uncontrolled power flow. Three transmission lines are shown each with capacity to carry about 150 MVA supplying a load of about 270 MVA. As shown, the transmission lines have the same per unit length parameters (impedances) but the bottom transmission line is a third longer than each of the two top transmission lines. Thus, the total length of the top path of supply is about 50% longer than the bottom path. Although both paths have a total nominal capacity of about 300 MVA, the natural power flows due to impedance distribution lead to about a 12% overload of the bottom line, preventing the system from supplying the coupled load.

Figure 4:
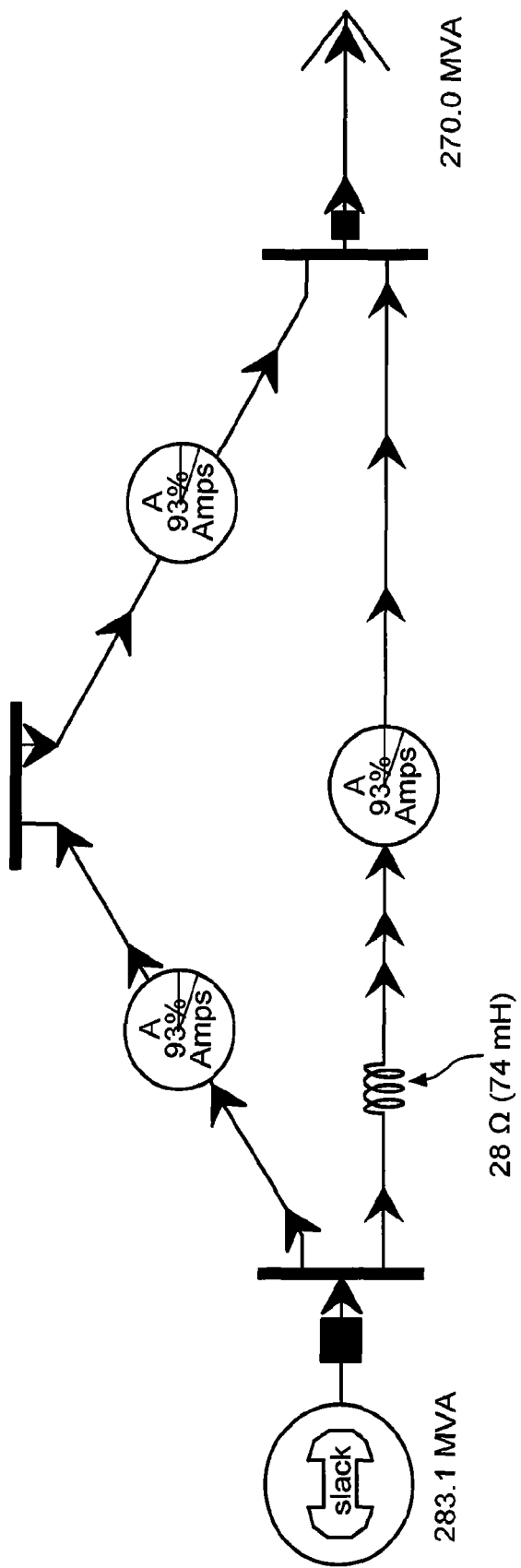
FIG. 4 is a line diagram of a magnetic amplifier controlled power flow.
Figure 5:
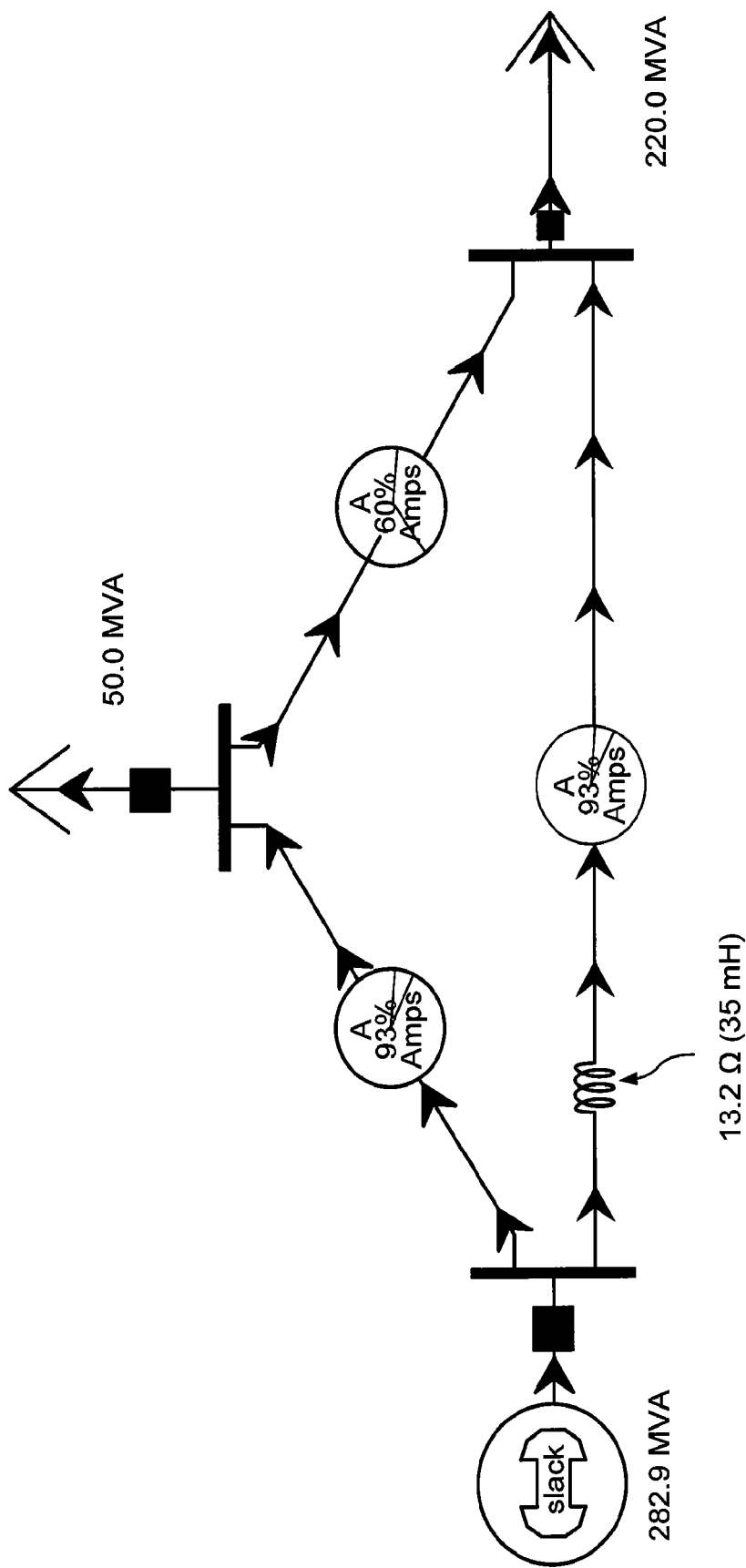
FIG. 5 is a second line diagram of a magnetic amplifier controlled power flow.

The inclusion of a magnetic amplifier shown as a saturable reactor with about 28Ω impedance in series with the bottom line in FIG. 4 allows the transmission lines to reach their limits almost simultaneously, optimizing power transfer. Different system conditions may also require different impedance values. For example, as shown in FIG. 5 if the load is redistributed so that about 50 MVA is supplied from the top bus in the system, an impedance of about 13.2Ω may be required to eliminate any overloads. If the saturable reactor has an impedance of about 28Ω as in FIG. 4, the impedance may result in about a 1% overload of the top left transmission line, while no impedance may result in about a 2% overload of the bottom transmission line.

The continuous impedance regulation and flexibility of control that the disclosed magnetic amplifiers or saturable reactors possess distinguish the disclosed systems from other power systems. The latter may have fixed impedance values and provide only binary control: previous systems can be either completely turned on or completely turned off. Magnetizable cores may not be necessary in the controllers used in such systems; thus, saturation may be avoided. Some power systems use un-saturable materials (air-core reactors) to avoid saturation. In contrast, a saturable core such as a ferromagnetic core may be used in the disclosed magnetic amplifiers and saturable reactors. The use of such cores, allow the magnetic amplifiers and saturable reactors to render any level of impedance from an intermediate value to any value between the amplifier/reactor's minimum (zero) and maximum impedance levels. As such, the disclosed systems provide a continuous level of control.

When used in meshed networks, one, two, or more (e.g., several) magnetic amplifiers or saturable reactors may effectively control current and power flow in a power system or transmission grid. Through the use of local transducers and/or local sensors that may monitor and record transmissions line states (e.g., current flow, voltage range, thermal conditions, etc.) and local controller devices (e.g., processor, computer, etc. shown in FIG. 7) and transceivers interfaced to the local electronic power converters that may control the bias currents (e.g., ac or dc) of one or more magnetic amplifiers/saturable reactors, the operating conditions of the high voltage transmission lines may be monitored and adjusted through a wireless and/or physical bus. In some systems a local or distributed server or server cluster may collect, process and modify the state of the system. A communication infrastructure such as SCADA (Supervisory Control and Data Acquisition) or other communication systems can be used for coordination among the devices for distributed, system-wide control.

An alternative mesh based network may allow the controllers of the magnetic amplifiers/saturable reactors to communicate with each other. In some power system architectures, some or all of the controllers of the magnetic amplifiers/saturable reactors may also serve as a node in the mesh communication network and act as an independent router or modem-router, regardless of whether the controllers are connected to another communication network. Some controllers may facilitate continuous connections and automated reconfiguration around non-functional or disrupted power flows by hopping data from node to node in a power grid or power system until a desired destination is reached.

In some systems, the controllers may modify the monitored power related data that is transmitted from node to node by adding or inserting data to a payload, header, or metadata, for example; reconfiguring payload, header, or metadata; or executing a combination of processing schemes, etc. The data may capture dynamic and/or static information about the power system, transmission lines and/or communication architecture, such as the configuration or reconfiguration of the power flows, transmission lines, and/or communication network including its dead zones, its disrupted connections, etc. Local or remote analysis (e.g., by selected smart/local programmed computer controlled magnetic amplifiers/saturable reactors in line or by the remote servers or server cluster(s)) of the data, may reflect real-time state of the power flow, transmission lines, and communication lines, the physical or operational state of infrastructure, and result in real-time or near real-time notifications transmitted to a destination such as the server or server cluster(s) or may comprise notifications sent to systems or devices outside of the mesh network. The notifications may comprise a short message service, an email feature, tactile feedback, or other functionality that sends voice, graphics, and/or textual messages (e.g., audio, visual, vibration) to mobile or fixed destination. Some real-time alerts are accessible through a Web browser via a Web page that may display the status of the issue that is being monitored. In response to such notifications, the server or server cluster(s) may further convey commands and data to the controllers that modify the topology of one or more transmission grids without interruption or minimal interruption in power delivery.

Figure 7:
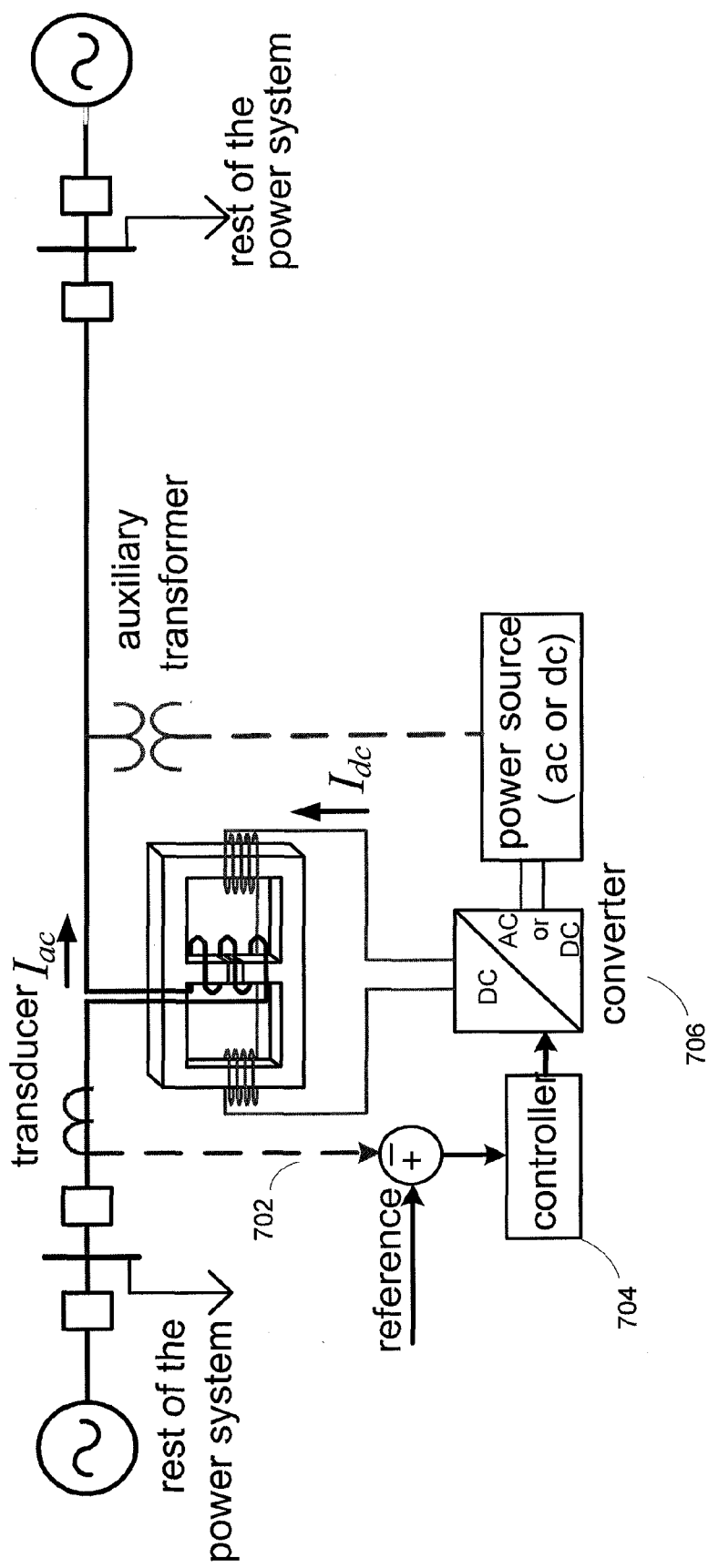
FIG. 7 is a power flow controller connection diagram.

Another controller connection diagram is shown in FIG. 7. Besides the control (dc or ac) and controlled (ac) circuit, measurement and power supply connections are also shown. One, two, or more transducers may monitor the power line and may comprise a current (or instrument) transformer. Monitored data may be transmitted directly through a local feedback link or channel 702 to a controller 704 that may regulate the power electronic converter 706 and the amount of bias current that flows in the dc circuit. In alternative systems, control data may be received from remote servers or server clusters through wireless or tangible communication links. In some systems an optional reference value may be set remotely through communication links or it may be pre-set locally.

In some alternative systems, the power electronic converter 706 may comprise a local power supply that provides a source that generates a bias dc magnetic flux. In some other systems, power from an auxiliary transformer may provide the power needed through a power circuit or the local substation. Other systems may use a combination. Depending on the selected source, some circuit converters may have one or more conversion stages. When an ac source is used, for example, an external or an auxiliary transformer and a rectifier bridge may be used as a front-end converter that converts the ac input voltage to dc. This voltage may then be converted to the level required for the dc bias current using a second power conversion stage. When a dc external source is used (e.g. battery) in some systems, only the secondary power conversion may be needed.

The power converter architecture of some systems may depend on the voltage and current requirements of the system as well as the required switching frequency. For control circuit voltages less than 300 V, MOSFET and Schottky diodes may be used. For voltages above 300 V, IGBTs and pin diodes may be used. For a faster switching control circuit, fast silicon carbide (SiC) power switches and diodes may be used.

In some systems a local feedback may be necessary when a controller 704 operates in autonomous mode. Operation in an autonomous mode may comprise a coordinated or uncoordinated operation. In the latter, some controllers 704 are programmed to make decisions based on the local and pre-programmed information. An example of uncoordinated autonomous mode of operation may occur when the controller executes routines stored in a non-transitory media that causes the system to be used as a current limiter. The system senses the current flow via one or more transducers and adjusts the reactance in the feedback loop over the dc circuit to limit the current in the controlled circuit to the pre-programmed value.

A coordinated autonomous mode of operation may be used for wide area control allowing the controller 704 to make decisions based not only on local measurements and data stored in a non-transitory media but also on remote information sent by other controllers and devices in the system as shown in FIG. 8. One possible difference between this mode of operation and the one previously described and shown in FIG. 6 is that there may not be centralized location where all the information is gathered and stored in a database and in which central decisions are conveyed from. The control may be distributed with the intelligence. Some power systems operating in this mode may route power much like a publicly accessible or privately accessible computer network that routes information. Such systems may be very resilient because they may be self-adapting to changing conditions caused by natural causes or attacks, physical and/or cyber-attacks.

FIG. 8 shows one possible configuration of communication links among the substations in a distributed system that will allow for distributed, system-wide control in autonomous coordinated mode. In FIG. 8 controllers exchange information via the communication servers (or processors) operating in each geographically remote substation. These computer servers may gather information not only from the local controllers but also from the sources, loads and other devices connected to the substation. For reliability purposes, redundant communication servers may also be used.

The stand-alone or network based magnetic amplifiers/saturable reactors may also operate as an in-line transient damper, a phase balancer, or fault current limiter, for example. When operating as a transient damper, the local or remote electronic converter (or a separate controller interfaced to the electronic converter and in-line alternating current transducer or sensor) may increase or decrease the reactance within the power winding when transducer and/or sensor detects or measures a short-lived or unpredictable increase or fluctuation in power such as a voltage/current spike or surge. Three or more stand-alone or network based magnetic amplifier/saturable reactors may also operate as a phase balancer (e.g., smoothing out some or any imbalances among the phases caused by unequal loads, unsymmetrical system elements, and other imperfections) through three independent local or remote controllers and magnetic amplifiers/saturable reactors. By independently varying the reactance in each power winding, the cluster of magnetic amplifier/saturable reactor may supply a balanced three phase load at a required voltage and current. This may be important in power distribution systems where due to many single phase loads phase imbalance can be high and can have adverse effects on the power system operation. When operating as fault current limiters in power lines, the magnetic amplifier/saturable reactor cores may often be saturated and in a state of minimal impedance. During fault conditions, the large ac current drives the core out of saturation, increasing the power windings impedance to limit the fault current. The disclosure further contemplates that the disclosed stand-alone or network based magnetic amplifier/saturable reactor may have other uses in controlling and monitoring power applications.

The servers and controllers described may execute software encoded in a non-transitory signal bearing medium, or may reside in a memory resident to or interfaced to one or more processors or controllers that may support a tangible communication interface, wireless communication interface, or a wireless system. The memory may retain an ordered listing of executable instructions for implementing logical functions and may retain one or more database engines that access files composed of records, each of which contains fields, together with a set of operations for searching, sorting, recombining, and/or other functions that are also retained in memory. A logical function may be implemented through digital circuitry, through source code, or through analog circuitry. The software may be embodied in any non-transitory computer-readable medium or signal-bearing medium, for use by, or in connection with an instruction executable system, apparatus, and device, resident to system that may maintain a persistent or non-persistent connection with a destination. Such a system may include a computer-based system, a processor-containing system, or another system that includes an input and output interface that may communicate with a publicly accessible distributed network and/or privately accessible distributed network through a wireless or tangible communication bus through a public and/or proprietary protocol.

A "computer-readable medium," "machine-readable medium," "propagated-signal" medium, and/or "signal-bearing medium" may comprise a non-transitory medium that contains, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection having one or more wires, a portable magnetic or optical disk, a volatile memory such as a Random Access Memory (RAM), a Read-Only Memory (ROM), an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory.

The term "coupled" disclosed in this description may encompass both direct and indirect coupling. Thus, first and second parts are said to be coupled together when they directly contact one another, as well as when the first part couples to an intermediate part which couples either directly or via one or more additional intermediate parts to the second part. The term "position," "location," or "point" may encompass a range of positions, locations, or points. The term "substantially" or "about" may encompass a range that is largely, but not necessarily wholly, that which is specified. It encompasses all but a significant amount. When devices are responsive to commands events, and/or requests, the actions and/or steps of the devices, such as the operations that devices are performing, necessarily occur as a direct or indirect result of the preceding commands, events, actions, and/or requests. In other words, the operations occur as a result of the preceding operations. A device that is responsive to another requires more than an action (i.e., the device's response to) merely follow another action.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A magnetic amplifier that controls high-voltage power flow through power transmission and distribution lines comprising:
a saturable core, the saturable core comprising a plurality of legs; and
a plurality of control windings, each wound around a separate leg, spaced apart from each other and connected in series in an anti-symmetric relation, wherein the plurality of control windings generates a biasing magnetic flux that is conveyed through portions of the saturable core when a direct current (DC) control current flows through the plurality of control windings, and the plurality of control windings are configured in such a way that a an amount of the biasing magnetic flux arising from the DC control current flowing through one of the plurality of control windings is substantially equal to the an amount of the biasing magnetic flux flowing into a second of the plurality of control windings; where:
flow of the DC control current through each of the plurality of control windings changes a reluctance of the saturable core by driving those portions of the saturable core that convey the biasing magnetic flux, into saturation; and
the phasing of the plurality of control winding cancels out or limits a voltage induced in the plurality of control windings caused by an alternating load current passing about a portion of the saturable core;
a power converter coupled to the plurality of control windings, the power converter having a computer interface that allows a computer controller to regulate the DC control current flowing through the plurality of control windings; and
a transceiver coupled to the power converter that transmits state data on the condition of a power line that conveys the alternating load current;
the computer controller being interfaced to the transceiver and the power converter to regulate the magnitude of the alternating load current.

2. The magnetic amplifier of claim 1 further comprising a power winding spaced apart from the plurality of control windings on one of the plurality of legs of the saturable core that does not contain a control winding.

3. The magnetic amplifier of claim 2 where the flow of the control current through the plurality of control windings changes the level of the alternating load current passing to a load.

4. The magnetic amplifier of claim 3 where magnetic portions of the legs around which the plurality of control windings are wound, relative to the leg which the power winding is wound around, have substantially equal levels of saturation.

5. The magnetic amplifier of claim 3 where the level of saturation of the leg which the power winding is wound around is different than the level of saturation of the legs about which the plurality of control windings are wound around when the portions of the saturable core that convey the biasing magnetic flux, are in saturation.

6. The magnetic amplifier of claim 1 where the saturable core comprises a ferromagnetic material.

7. The magnetic amplifier of claim 1 further comprising two magnetic amplifiers and a plurality power converters, each of the plurality of power converters being coupled to one of the two magnetic amplifiers and the plurality of control windings, the power converters being programmed to vary induction and balance the phase of a three phase circuit.

8. The magnetic amplifier of claim 1 where the computer controller being further interfaced to a router or modem-router that conveys the state data through a mesh network and where the computer controller is programmed to generate the state data.

9. The magnetic amplifier of claim 1, wherein the power converter is programmed to dampen transients detected in the alternating load current by increasing or decreasing the reluctance of the saturable core and a power winding impedance in response to fluctuations in the alternating load current.

10. The magnetic amplifier of claim 1, wherein the power converter is programmed to dampen the alternating load current when a fault is detected in a high voltage power line conveying the alternating load current.

11. A magnetic amplifier that controls high-voltage power flow through power lines comprising
a saturable core, the saturable core comprising a plurality of legs;

a power winding wound around a leg of the saturable core that receives high voltage alternating current from high voltage power lines and delivers an alternating load current to a load;

a plurality of control windings, each wound in parallel around a separate leg, spaced apart from each other and the power windings, and connected in series in an anti-symmetric relation about the saturable core and configured in such a way that substantially all of a biasing magnetic flux arising from a control current flowing through the plurality of control windings and being conveyed by portions of the saturable core, does not flow through the leg which the power winding is wound about;

where flow of the control current through each of the plurality of control windings changes a reluctance of the saturable core and impedance of the power winding by driving only those portions of the saturable core that convey the biasing magnetic flux, into saturation; and where a phasing of the plurality of control winding cancel out a voltage induced in the plurality of control windings caused by the alternating load current passing through the power winding; and a power converter coupled to the plurality of control windings, the power converter programmed to dampen the alternating load current when a fault in a high voltage power line is detected.

12. The magnetic amplifier of claim 11, wherein the power converter is coupled to the plurality of control windings, the power converter programmed to dampen transients detected in the alternating load current by increasing or decreasing the reluctance of the saturable core in response to fluctuations in the alternating load current.

13. A magnetic amplifier that controls high-voltage power flow through power transmission and distribution lines comprising:

a saturable core, the saturable core comprising a plurality of legs; and a plurality of control windings, each wound around a separate leg, spaced apart from each other and connected in series in an anti-symmetric relation, wherein the plurality of control windings generates a biasing magnetic flux that is conveyed through portions of the saturable core when a direct current (DC) control current flows through the plurality of control windings, and the plurality of control windings are configured in such a way that an amount of the biasing magnetic flux arising from the DC control current flowing through one of the plurality of control windings is substantially equal to an amount of biasing magnetic flux flowing into a second of the plurality of control windings; where:

flow of the DC control current through each of the plurality of control windings changes a reluctance of the saturable core by driving those portions of the saturable core that convey the biasing magnetic flux in the saturable core, into saturation; and the phasing of the plurality of control winding cancels out or limits a voltage induced in the plurality of control windings caused by an alternating load current passing about a portion of the saturable core; and a power converter programmed to dampen the alternating load current when a fault is detected in a high voltage power line conveying the alternating load current.

14. The magnetic amplifier of claim 13 where the saturable core comprises a ferromagnetic material.

15. The magnetic amplifier of claim 13, wherein the power converter is programmed to dampen transients detected in the alternating load current by increasing or decreasing the reluctance of the saturable core and a power winding impedance in response to fluctuations in the alternating load current.

16. The magnetic amplifier of claim 13 further comprising two magnetic amplifiers and a plurality power converters, each of the plurality of power converters being coupled to one of the two magnetic amplifiers and the plurality of control windings, the power converters being programmed to vary induction and balance the phase of a three phase circuit.

17. The magnetic amplifier of claim 13, wherein the power converter has a computer interface that allows a computer controller to regulate the direct current flowing through the plurality of control windings; and a transceiver is coupled to the power converter that transmits state data on the condition of a power line that conveys the alternating load current;

the computer controller being interfaced to the transceiver and the power converter to regulate the magnitude of the alternating load current.

18. The magnetic amplifier of claim 17 where the computer controller is further interfaced to a router or modem-router that conveys the state data through a mesh network and where the computer controller is programmed to generate the state data.

19. The magnetic amplifier of claim 13 further comprising a power winding spaced apart from the plurality of control windings on one of the plurality of legs of the saturable core that does not contain a control winding.

20. The magnetic amplifier of claim 19 where the flow of the control current through the plurality of control windings changes the level of the alternating load current passing to a load.

21. The magnetic amplifier of claim 20 where magnetic portions of the legs around which the plurality of control windings are wound, relative to the leg which the power winding is wound around, have substantially equal levels of saturation.

22. The magnetic amplifier of claim 20 where the level of saturation of the leg which the power winding is wound around is different than the level of saturation of the legs about which the plurality of control windings are wound around when the portions of the saturable core that convey the biasing magnetic flux, are in saturation.

\* \* \* \* \*